United States Patent [19]

Takebuchi et al.

[11] Patent Number: 5,532,181
[45] Date of Patent: Jul. 2, 1996

[54] METHOD OF MANUFACTURING SEMICONDUCTOR NON-VOLATILE MEMORY DEVICE HAVING DIFFERENT GATE INSULATING THICKNESSES

[75] Inventors: Masataka Takebuchi, Yokohama; Daisuke Tohyama, Tokyo; Hidemitsu Ogura, Kawasaki, all of Japan

[73] Assignee: Kabushiki Kaisha Toshiba, Kawasaki, Japan

[21] Appl. No.: 223,052

[22] Filed: Apr. 5, 1994

Related U.S. Application Data

[62] Division of Ser. No. 986,731, Dec. 8, 1992, Pat. No. 5,324,972.

[30] Foreign Application Priority Data

Dec. 9, 1991 [JP] Japan .................... 3-324648
Sep. 16, 1992 [JP] Japan .................... 4-246827

[51] Int. Cl.⁶ .................................. H01L 21/8247
[52] U.S. Cl. ...................... 437/43; 437/45; 437/979
[58] Field of Search ........................ 437/43, 45, 56, 437/57, 58, 979; 148/DIG. 163

[56] References Cited

U.S. PATENT DOCUMENTS

| | | | |
|---|---|---|---|
| 4,288,863 | 9/1981 | Adam | 365/182 |
| 4,425,631 | 1/1984 | Adam | 257/318 |
| 4,651,406 | 3/1987 | Shimizu et al. | 437/45 |
| 4,823,316 | 4/1989 | Riva | 257/321 |
| 4,851,361 | 7/1989 | Schumann et al. | 437/43 |
| 4,870,615 | 9/1989 | Maruyama et al. | 257/321 |
| 4,935,790 | 6/1990 | Cappelletti et al. | 257/321 |
| 5,225,700 | 7/1993 | Smayling | 257/321 |
| 5,324,677 | 6/1994 | Ishii | 437/43 |

OTHER PUBLICATIONS

Roger Cuppens et al., "An EEPROM for Microprocessors and Custom Logic", IEEE ISSCC Tech. Dig., p. 268, 1984.
Masataka Takebuchi et al., "A Novel Integration Technology of EEPROM Embedded CMOS Logic VLSI Suitable for ASIC Applications", IEEE CICC Proceedings, 1992.

*Primary Examiner*—Chandra Chaudhari
*Attorney, Agent, or Firm*—Banner & Allegretti, Ltd.

[57] ABSTRACT

According to this invention, a semiconductor non-volatile memory device includes a semiconductor substrate, insulating films formed on the semiconductor substrate and having at least two types of gate insulating films having different thicknesses and a first conductive film formed on the insulating films and electrically floating from the semiconductor substrate through the insulating films. These at least two types of gate insulating films include a first insulating film formed on said semiconductor substrate and a first diffusion layer of a conductivity type and a second insulating film formed on said semiconductor substrate and a second diffusion layer, of the opposite conductivity type, which is isolated from the first diffusion layer. The first conductive film is formed on the first and second insulating films. A part of the first insulating film between the first conductive film and the first diffusion layer is constituted by a third insulating film having a thickness smaller than that of the first insulating film.

10 Claims, 10 Drawing Sheets

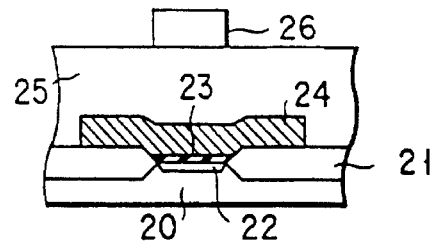
F I G. 1A
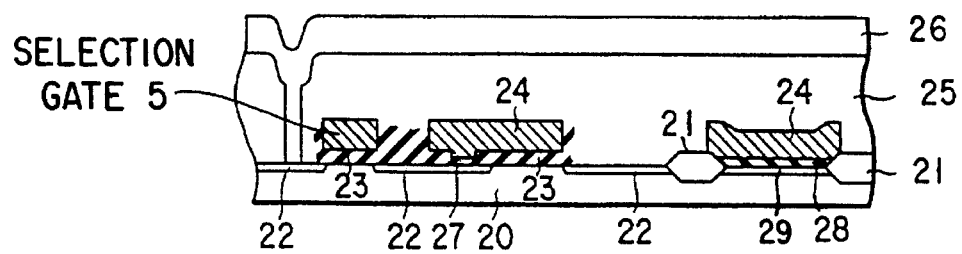
F I G. 1B
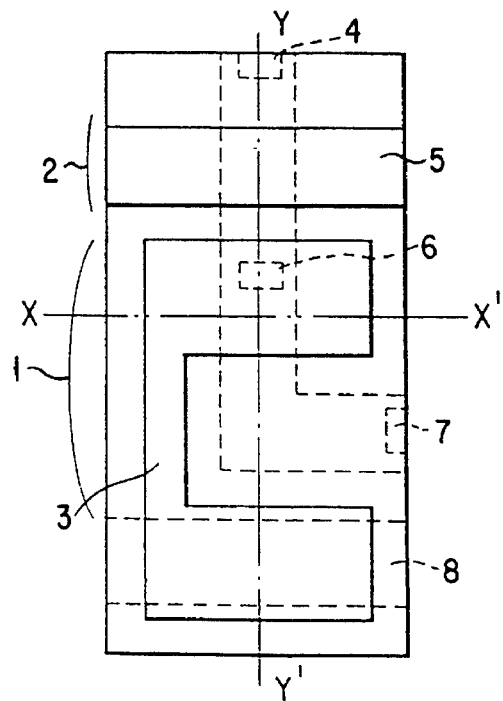
F I G. 2

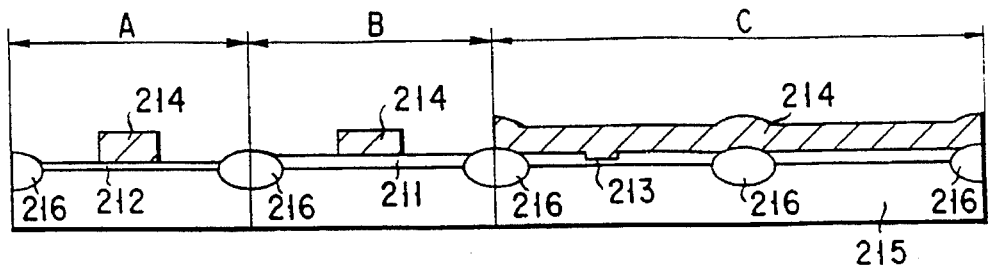
F I G. 8
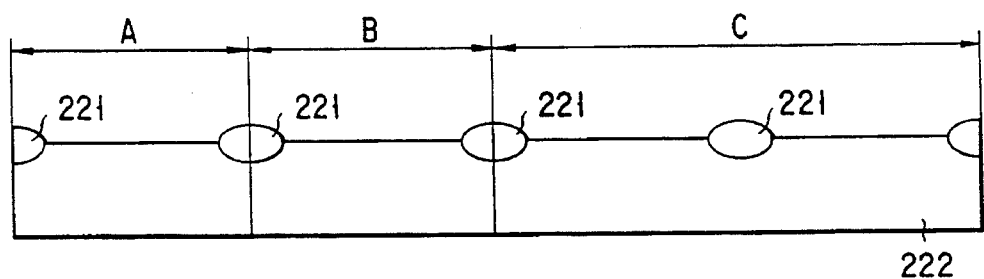
F I G. 9
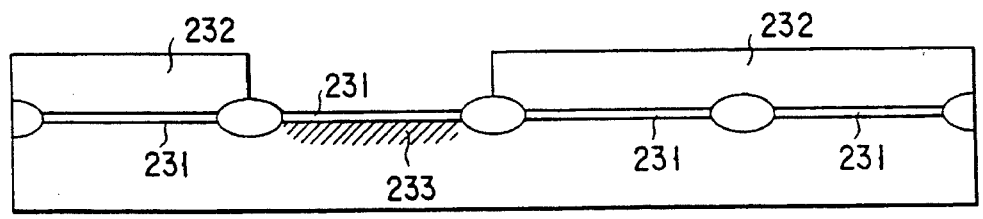
F I G. 10
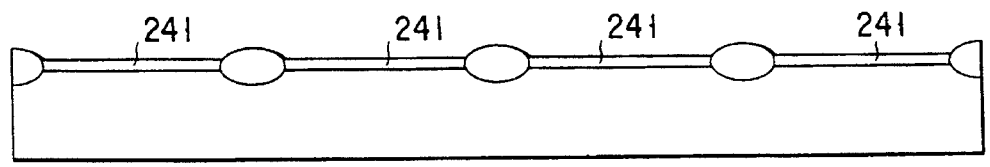
F I G. 11

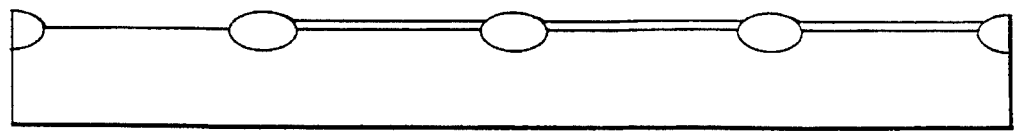
F I G. 12
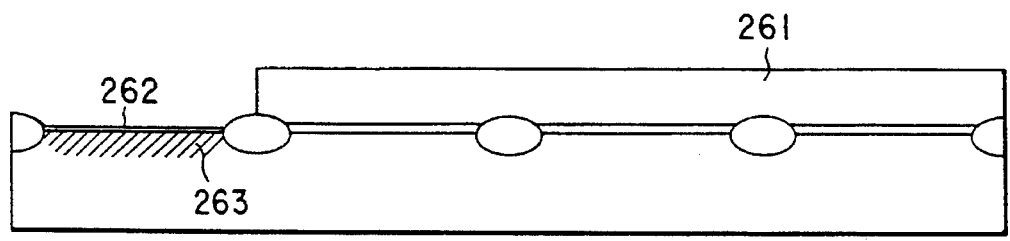
F I G. 13
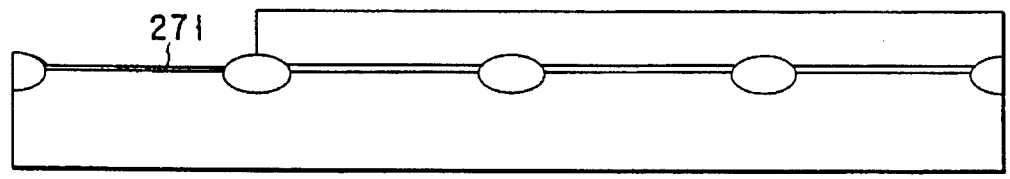
F I G. 14
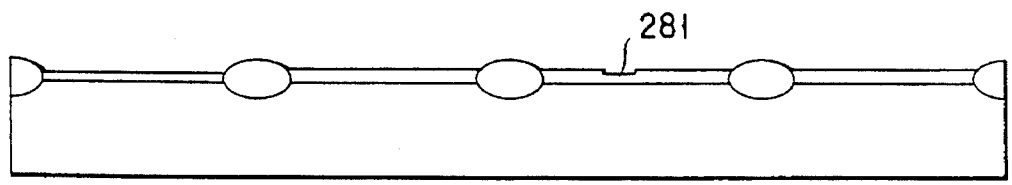
F I G. 15

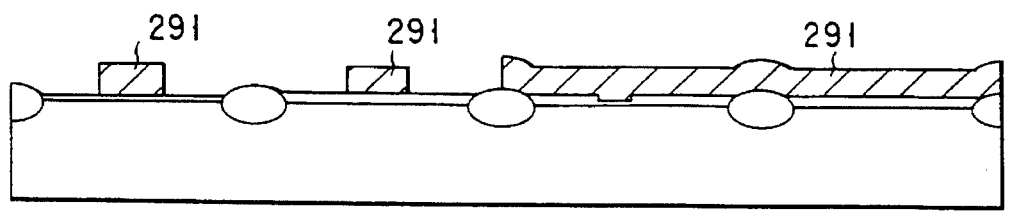
F I G. 16
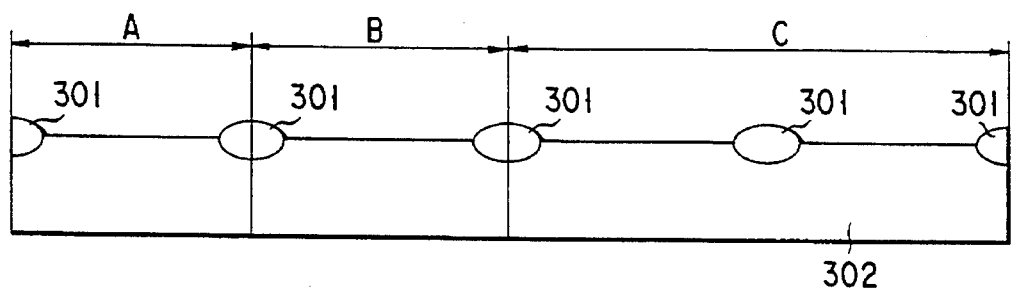
F I G. 17
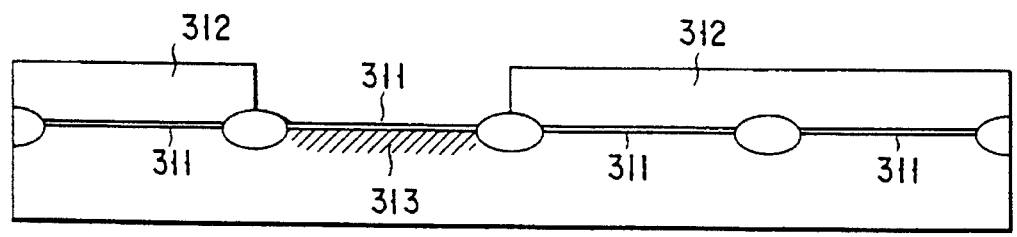
F I G. 18
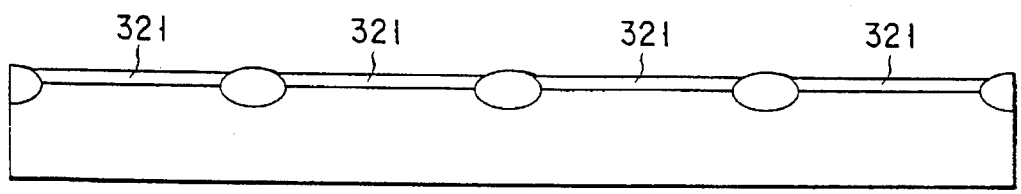
F I G. 19

METHOD OF MANUFACTURING SEMICONDUCTOR NON-VOLATILE MEMORY DEVICE HAVING DIFFERENT GATE INSULATING THICKNESSES

This application is a division of application Ser. No. 07/986,731, filed Dec. 8, 1992 now U.S. Pat. No 5,324,972.

BACKGROUND OF THE INVENTION

1. Field of the Invention

The present invention relates to a semiconductor memory device and a method of manufacturing the same and, more particularly to a semiconductor memory device used as a non-volatile memory device and a method of manufacturing the same.

2. Description of the Related Art

FIGS. 24A to 24C show a conventional semiconductor non-volatile memory device, in which FIG. 24A shows a high breakdown voltage transistor, FIG. 24B shows a memory cell transistor, and FIG. 24C shows a 5 V system transistor. The memory cell transistor in FIG. 24B has a two-layered conductive film structure constituted by a floating gate and a control gate. The floating gate is formed by a first conductive film 14 and the control gate is formed by a second conductive film 17. The gate electrode of a 5 V system transistor at the periphery of the memory cell transistor is formed by the second conductive film 17.

An electrically programmable non-volatile memory device will be described below. The thicknesses of the insulating films in FIGS. 24A to 24C have the following relationship: $T_{OX1}$ (a charge injection/extraction region or a tunnel region 15)<$T_{OX2}$ (a 5 V system gate insulating film 18)<$T_{OX3}$ (a high breakdown voltage gate insulating film 13). In manufacturing the memory, the high breakdown voltage insulating film 13 is formed on a semiconductor substrate 11, and an opening is formed to form the tunnel region 15 using normal photoetching. Thereafter, the first conductive film 14 is formed, a cell slit is formed by photoetching, and the first conductive region in a 5 V system region and the high breakdown voltage insulating film 13 are sequentially etched.

Thereafter, the 5 V system gate insulating film 18 10 is formed. At the same time, an insulating film 16 is formed on the floating gate. Furthermore, the second conductive film 17 is formed. In FIGS. 24A to 24C, reference numerals 12 denote diffusion layers each having a conductivity type opposite to that of the semiconductor substrate 11.

In the above-described prior art, an electrically erasable and programmable non-volatile memory (to be referred to as an EEPROM hereinafter) and a logic circuit (5 V system) are formed on the same substrate. The former has a two-layered conductive film gate structure, but the latter has a single conductive film gate, and three types of films consisting of an insulating film between the floating gate and the control gate, the high breakdown voltage gate insulating film, and the tunnel insulating film, and one type of the 5 V system insulating film, i.e., a total of four types of insulating films must be arranged in the EEPROM region. Therefore, the EEPROM and the logic circuit are not properly matched with each other on a single chip.

SUMMARY OF THE INVENTION

It is, therefore, an object of the present invention to provide a semiconductor memory device in which a non-volatile memory applied with a high voltage and a 5 V system logic circuit can be properly matched on a single chip, and a method of manufacturing the semiconductor memory device.

In order to achieve the above object, according to the first aspect of the present invention, there is provided a semiconductor non-volatile memory device comprising:

a semiconductor substrate;

insulating films formed on the semiconductor substrate and including at least two types of gate insulating films having different thicknesses; and a first conductive film formed on the insulating films and electrically floating from the semiconductor substrate through the insulating films.

According to the second aspect of the present invention, there is provided a method of manufacturing a semiconductor non-volatile memory device, comprising the steps of:

performing element isolation to isolate an element active region and a field region performing normal photoetching, selectively implanting ions;

forming a first insulating film;

etching a part of the first insulating film using photoetching;

forming a second insulating film;

etching parts of the first and second insulating films using photoetching;

forming a third insulating film; and depositing a first polysilicon film.

According to the third aspect of the present invention, there is provided a method of manufacturing a semiconductor device, comprising the steps of:

forming a first oxide film having a first film thickness on a semiconductor substrate;

masking a part of a surface region of the first oxide film with a first photoresist using photoetching;

removing an exposed part of the first oxide film removing the first photoresist; and forming a second oxide film having a second film thickness.

According to the fourth aspect of the present invention, there is provided a method of manufacturing a semiconductor device, comprising the steps of:

forming a first oxide film having a first film thickness on a semiconductor substrate;

masking a part of a surface region of the first oxide film with a first photoresist using photoetching implanting impurity ions in a silicon substrate through a first part in which the first oxide film is exposed;

removing the first photoresist;

masking the part of the surface region of the first oxide film with a second photoresist using photoetching;

removing a second part in which the first oxide film is exposed;

removing the second photoresist; and forming a second oxide film having a second film thickness.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are sectional views showing the structure of a memory device according to the first embodiment of the present invention;

FIG. 2 is a plan view showing a pattern of the memory device according to the first embodiment of the present invention;

FIG. 8 is a sectional view showing a memory device in which a logic transistor and a cell having a one-layered polysilicon structure are integrally arranged;

FIG. 9 is a sectional view showing a part of a detailed process of a method of manufacturing the memory device according to the first embodiment of the present invention;

FIG. 10 is a sectional view showing another part of the detailed process of the method of manufacturing the memory device according to the first embodiment of the present invention;

FIG. 11 is a sectional view showing still another part of the detailed process of the method of manufacturing the memory device according to the first embodiment of the present invention FIG. 12 is a sectional view showing still another part of the detailed process of the method of manufacturing the memory device according to the first embodiment of the present invention;

FIG. 13 is a sectional view showing still another part of the detailed process of the method of manufacturing the memory device according to the first embodiment of the present invention;

FIG. 14 is a sectional view showing still another part of the detailed process of the method of manufacturing the memory device according to the first embodiment of the present invention FIG. 15 is a sectional view showing still another part of the detailed process of the method of manufacturing the memory device according to the first embodiment of the present invention;

FIG. 16 is a sectional view showing still another part of the detailed process of the method of manufacturing the memory device according to the first embodiment of the present invention;

FIG. 17 is a sectional view showing a part of an improved process of the method of manufacturing the memory device according to the first embodiment of the present invention FIG. 18 is a sectional view showing another part of the improved process of the method of manufacturing the memory device according to the first embodiment of the present invention;

FIG. 19 is a sectional view showing still another part of the improved process of the method of manufacturing the memory device according to the first embodiment of the present invention;

DETAILED DESCRIPTION OF THE PREFERRED EMBODIMENTS

Figure 3A:
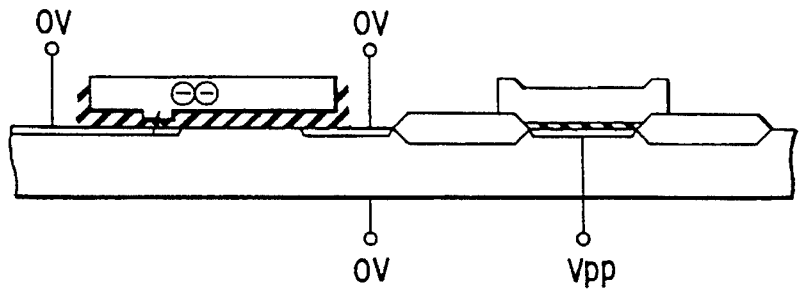
FIGS. 3A to 3C are sectional views showing the bias states of an electron injection operation, an electron extraction operation, and a read operation, respectively.

An electrically erasable and programmable semiconductor non-volatile memory (EEPROM) according to the first embodiment of the present invention will be described below.

FIG. 2 is a plan view showing the pattern of the EEPROM. FIGS. 1A and 1B are sectional views showing the structure of the EEPROM. FIG. 1A is a sectional view showing the structure along a line X–X' in FIG. 2, and FIG. 1B is a sectional view showing the structure along a line Y–Y' in FIG. 2.

As shown in FIG. 2, in this embodiment, each actual memory cell is constituted by a realizable memory transistor 1 and a selection transistor 2, i.e., a total of two transistors. Of the two transistors, the memory transistor 1 has a threshold value which is changed into enhancement and depletion threshold values by storing/depleting electrons in a floating gate 3 when the two different threshold values are read out, the presence/absence of information is determined as information for an LSI. On the other hand, the selection transistor 2 is used to interrupt the interference between a selected cell and a non-selected cell, and interference occurring in update and read modes is interrupted. In addition, in FIG. 2, reference numeral 4 denotes a drain contact; 5, a selection gate 6, a tunnel window 7, a source contact; and 8, a control gate.

The characteristic feature of the embodiment is the structure of the memory transistor 1. As shown in the sectional view of FIG. 1B, the memory transistor 1 is formed so that three different types of insulating films, i.e., a high breakdown voltage insulating film 23, an insulating film 28 made by the same method and having the same thickness as that of a 5 V gate insulating film, and a tunnel insulating film 27, are present below a first conductive electrode (floating gate) 24. In this case, the thicknesses of these films satisfy a condition of (high breakdown voltage insulating film 23)>(5 V system gate insulating film 28)>(first polysilicon layer 27).

In addition, a first region in which the high breakdown voltage insulating film 23 serving as a first insulating film is formed is present on a semiconductor substrate 20 and on a diffusion layer 22 of a conductivity type, opposite to that of the substrate 20, which is formed in the surface region of the semiconductor substrate 20. A second region in which the 5 V system gate insulating film 28 serving as a second insulating film is formed is present on another diffusion layer 29 having a conductivity type opposite to that of the semiconductor substrate 20 and isolated from the diffusion layer 22. The first region can be roughly divided into a charge injection/extraction region and the remaining channel region of the memory transistor. The channel region is constituted by the high breakdown voltage insulating film 23 having a thickness of about 400 Å, and the charge injection/extraction region is constituted by the tunnel insulating film 27 having a thickness of about 90 Å. The second region is a location which obtains a capacitive coupling ratio for smoothly performing the charge injection/extraction in the first region, and the second region is constituted by the insulating film 28 having a thickness of about 150 Å. In this case, facilitation of the charge injection/extraction depends on the capacitive coupling ratio as a parameter. In short, when the capacitances of the first and second regions are represented by $C_1$ and $C_2$, respectively, the capacitive coupling ratio is calculated by $C_2/C_1$. In FIGS. 1A and 1B, reference numeral 21 denotes a field region; 25, an interlayer insulator; and 26, a metal wiring layer.

Figure 3B:
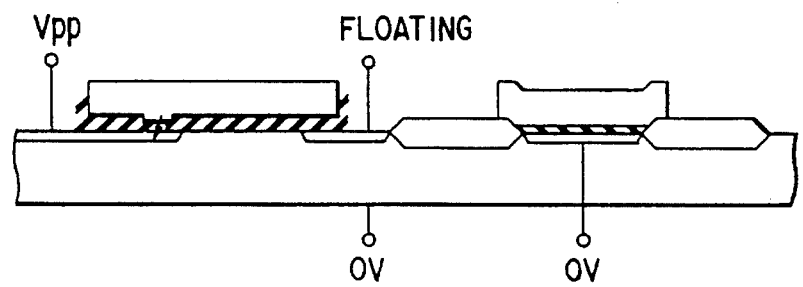
Figure 3C:
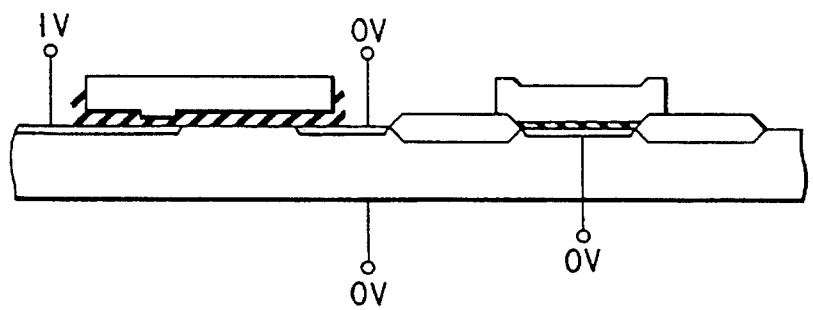

FIGS. 3A, 3B, and 3C show the bias states of the memory transistor 1 in write and read modes. FIG. 3A shows an injection state of electrons, FIG. 3B shows an extraction state of electrons, and FIG. 3C shows a read state. The operation of the memory device except for the selection transistor 2 will be described below.

First, electrons are injected as follows. That is, a voltage of 0 V and a voltage $V_{PP}$ are applied to the diffusion layer below a tunnel region and the control gate, respectively to inject electrons from the diffusion layer below the tunnel region in the floating gate on the basis of the capacitive coupling ratio. In contrast to this, the electrons are extracted as follows. That is, the voltage $V_{PP}$ and the voltage of 0 V are applied to the diffusion layer below the tunnel region and the control gate, respectively to extract the electrons from the floating gate to the diffusion layer below the tunnel region. In addition, in a read mode, voltages of 0 V, 0 V, and about 1 V are applied to the control gate, the source, and the drain, respectively, and the presence/absence of information is determined while the channel current of the memory transistor is observed.

Note that one source line is arranged for 2 bits in a column direction.

The steps in manufacturing a memory device for realizing the first embodiment will be described below with reference to FIGS. 4A to 4E.

Figure 4A:
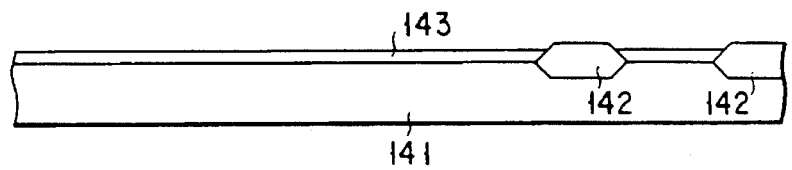
FIGS. 4A to 4E are sectional views showing the steps in manufacturing the memory device for realizing the first embodiment of the present invention.

After normal isolation is performed, a first gate oxide film (high breakdown voltage gate oxide film) 143 is formed to have a thickness of about 330 Å (FIG. 4A).

Figure 4B:
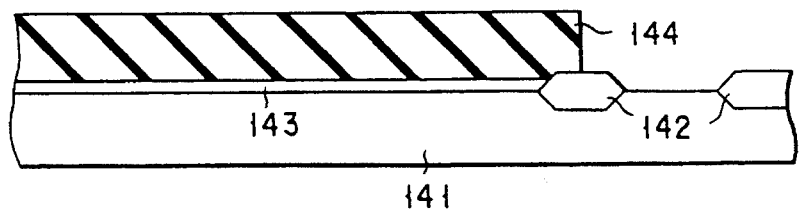

A part, of the oxide film 143, which is formed in a 5 V system region is etched using normal photoetching (FIG. 4B).

Figure 4C:
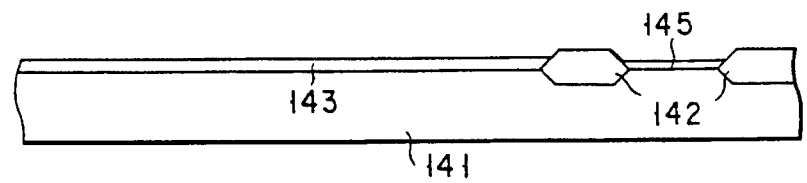
Figure 4D:
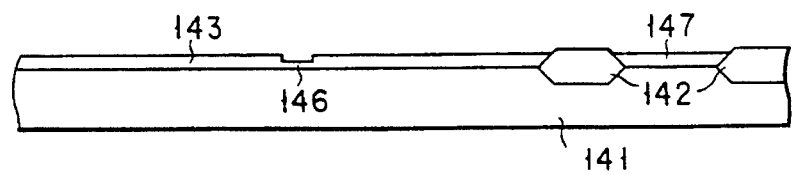

A film having a thickness of about 110 Å is formed as a 5 V system first insulating film 145 such that a 5 V system oxide film which is subjected to very-thin-film oxidation to be performed in the step of FIG. 4D has a total thickness of about 110 Å (FIG. 4C).

After a tunnel window is formed using normal photoetching, a tunnel oxide film 146 is formed to have a thickness of 90 Å. At this time, an oxide film 147 having a thickness of 150 Å is grown on the logic gate made by the same method and having the same thickness as that of a 5 V logic gate, and the high breakdown voltage oxide film is grown to have a thickness of 400 Å. In addition, a first conductive film is deposited (FIG. 4D).

Figure 4E:
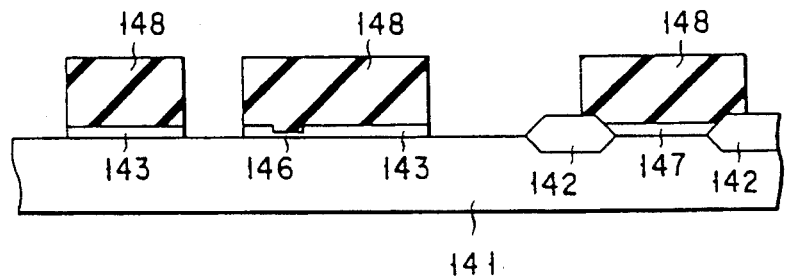

By using the normal photoetching again, a pattern for forming various transistors such as a high breakdown voltage system (including a cell) transistor and a 5 V system transistor are formed by performing patterning once (FIG. 4E).

In FIGS. 4A to 4D, reference numeral 141 denotes a semiconductor substrate; 142, field regions; 144, a resist; and 148, first conductive films.

The above steps will be described below in detail. In this case, as shown in FIG. 8, a sectional view showing a memory device in which a logic transistor and a cell (to be referred to as single-poly cell hereinafter) having a single-layered polysilicon structure including a high breakdown voltage transistor are integrally arranged is used. In FIG. 8, reference symbol A denotes a logic region; B, a high breakdown voltage region; and C, a cell region. In order to integrally arrange the logic transistor and the single-poly cell, as the characteristic feature of the embodiment, oxide films having three different thicknesses are present below a first polysilicon layer (FIG. 8).

A method of forming the above structure will be described below using FIGS. 9 to 16.

Isolation oxide films 221 are formed on a semiconductor substrate 222 using local oxidation to electrically isolate element regions from each other (FIG. 9). First dummy oxide films 231 are formed using thermal oxidation, regions other than a region 233 in which impurity ion implantation of the high breakdown voltage region is to be performed are masked with a photoresist 232 using photoetching, and impurity ions are implanted in the exposed region (FIG. 10). The first dummy oxide film damaged by the impurity ion implantation is entirely removed by, e.g., wet etching, and a first oxide film 241 having a first film thickness is formed in the high breakdown voltage region using thermal oxidation (FIG. 11). The regions other than the logic region are masked with a photoresist, and the first oxide film in the exposed logic region is removed by, e.g., wet etching (FIG. 12). A second dummy oxide film 262 is formed using thermal oxidation, the regions other than a region 263 in which impurity ion implantation of the logic region is to be performed are masked with a photoresist 261 using photoetching, and impurity ions are implanted in the exposed region (FIG. 13). The second dummy oxide film in the exposed logic region damaged by the impurity ion implantation is removed by, e.g., wet etching while the second sacrifice oxide film in the high breakdown voltage region is masked with a photoresist, and a second oxide film 271 having a second thickness is formed by thermal oxidation (FIG. 14). The cell region except for a tunnel portion is masked with a photoresist using photoetching, and the exposed tunnel portion is removed by, e.g., wet etching, and a third oxide film 281 having a third film thickness is formed using thermal oxidation (FIG. 15). After first polysilicon layer 291 serving as electrodes is deposited by chemical vapor-phase deposition, an impurity is diffused. A part of the first polysilicon layer is masked with a photoresist using photoetching, and the exposed region is patterned using RIE (FIG. 16).

A modification obtained by improving the above steps will be described below using sectional views showing a structure wherein a single-poly cell and a logic transistor are integrally arranged.

In FIG. 17, reference symbol A denotes a logic region B, a high breakdown voltage region and C, a cell region. In order to integrally arrange a logic transistor and a single-poly cell, as a characteristic feature, oxide films having three different thicknesses are present below a first polysilicon layer.

A method of forming this structure will be described below using FIGS. 17 to 23.

Isolation oxide films 301 are formed on a semiconductor substrate 302 using local oxidation to electrically isolate element regions from each other (FIG. 17). A first sacrifice oxide film is formed using thermal oxidation, the regions other than a region 313 in which impurity ion implantation of the high breakdown voltage region is to be performed are masked with a photoresist 312 using photoetching, and impurity ion implantation is performed in the exposed region (FIG. 18). The first dummy oxide film damaged by the impurity ion implantation is entirely removed by, e.g., wet etching, and first oxide films 321 each having a first film thickness are formed using thermal oxidation (FIG. 19).

Figure 20:
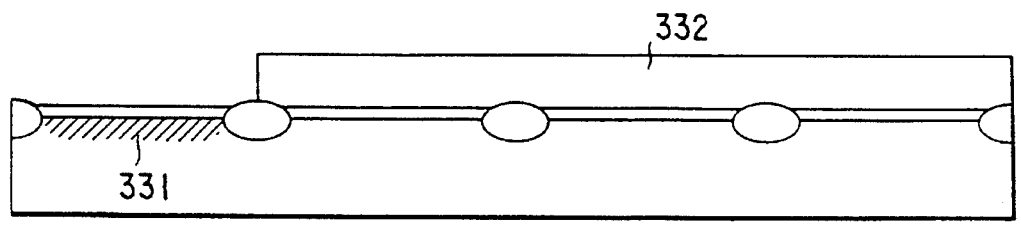
FIG. 20 is a sectional view showing still another part of the improved process of the method of manufacturing the memory device according to the first embodiment of the present invention.
Figure 21:
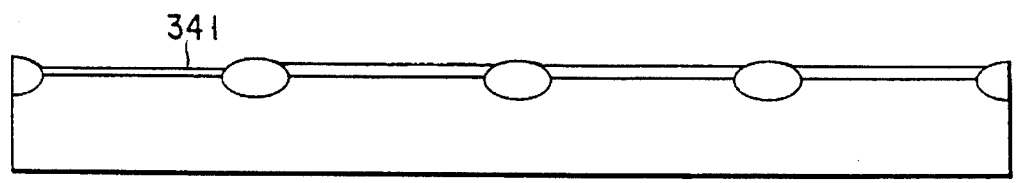
FIG. 21 is a sectional view showing still another part of the improved process of the method of manufacturing the memory device according to the first embodiment of the present invention.

The regions other than an impurity ion implantation region 331 in the logic region are masked with a photoresist 332, and impurity ion implantation is performed while the first oxide film in the exposed region is used as the dummy oxide film of the logic region (FIG. 20). The regions other than the logic region are masked with a photoresist using photoetching, the exposed first oxide film is removed by, e.g., wet etching, and a second oxide film 341 having a second film thickness is formed in the logic region using thermal oxidation (FIG. 21).

Figure 22:
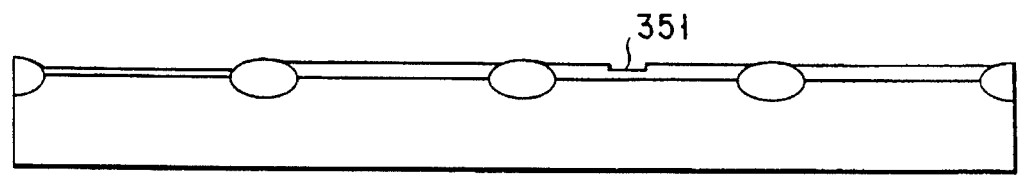
FIG. 22 is a sectional view showing still another part of the improved process of the method of manufacturing the memory device according to the first embodiment of the present invention.
Figure 23:
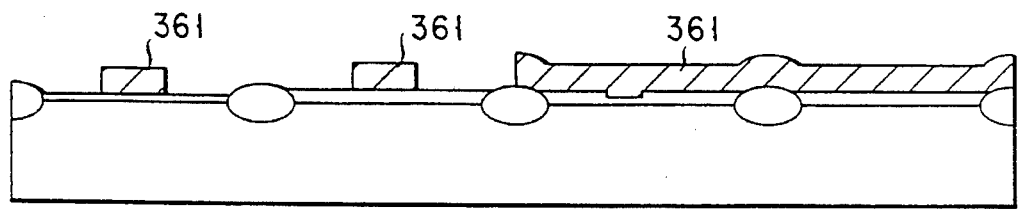
FIG. 23 is a sectional view showing still another part of the improved process of the method of manufacturing the memory device according to the first embodiment of the present invention.
Figure 24A:
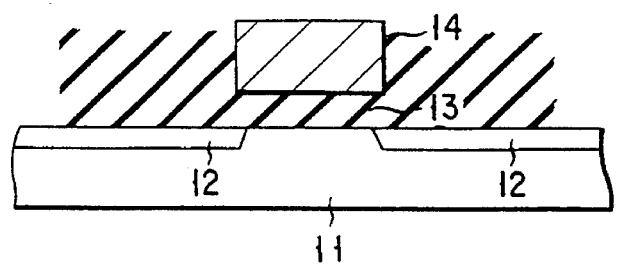
FIGS. 24A to 24C are sectional views showing a conventional semiconductor non-volatile memory device.
Figure 24B:
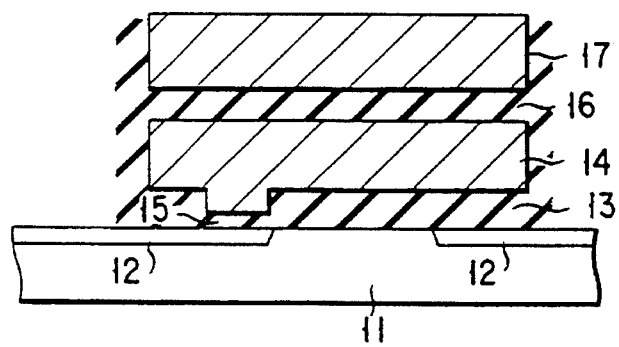
Figure 24C:
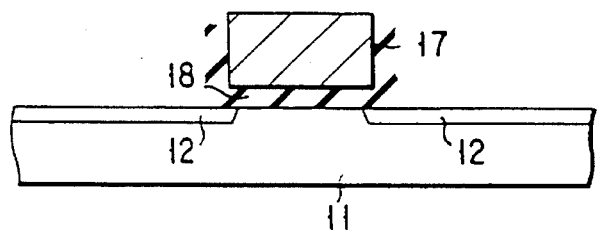

The cell region except for a tunnel portion is masked with a photoresist using photoetching, the exposed tunnel portion is removed by, e.g., wet etching, and a third oxide film 351 having a third film thickness is formed using thermal oxidation (FIG. 22). After a first polysilicon layer 361 serving as electrodes is deposited by chemical vapor-phase deposition, an impurity is diffused. A part of the first polysilicon layer is masked with a photoresist using photoetching, and the exposed region is patterned using RIE (FIG. 23).

In this manner, the oxide films having three different thicknesses can be formed below the first polysilicon layer by a smaller number of steps.

According to the above embodiment, although photoetching is performed four times to form a gate and a transistor pattern in a conventional method, the gate and the transistor pattern can be formed by performing photoetching three times.

In addition, a highly dielectric material may be used for the capacitance $C_2$ in the form of, e.g., a three-layered structure of an oxide film/a nitride film/an oxide film (to be referred to as an ONO hereinafter) to increase a capacitive coupling ratio.

Since the ONO is used as the insulating film in the electron injection/extraction region, it is expected to increase the number of update operations. When a nitride-oxide film (formed such that, after an oxide film is formed, the oxide film is thermally treated in a gas containing at least nitrogen atoms) is used as the insulating film, the same effect as described above can be expected.

Figure 5:
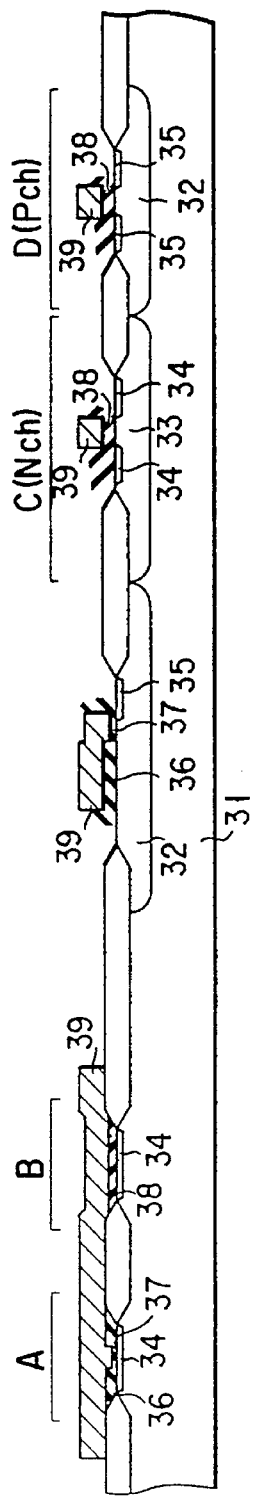
FIG. 5 is a sectional view showing the structure of the second embodiment of the present invention.

The second embodiment of the present invention will be described below with reference to FIG. 5.

In this embodiment, an EEPROM region, an OTPROM (One-Time-PROM) region (a ROM in which data can be written only once), and a LOGIC region are formed on a semiconductor substrate 31, and a gate electrode is formed by films up to a first polysilicon film. In FIG. 5, since a description of operations has the top priority, parts which are not required in the following description are omitted.

The EEPROM region is divided into regions A and B. The region A is a charge injection/extraction region. On the other hand, the region B is a region having a capacitor which controls the injection and extraction of charges in the region A. Gate oxide films are three types of films, i.e., a high breakdown voltage oxide film 36 (400 Å), a tunnel oxide film 37 (90 Å), and a logic oxide film 38 (150 Å).

A write operation will be described below.

First, electrons are injected in a floating gate 39 as follows. An n-type diffusion layer 34 in the region A and the substrate 31 are biased to 0 V, and a control gate 34 serving as the n-type diffusion layer in the region B is biased to $V_{pp1}$ (a high voltage applied to perform the write operation, 16 V in this case). At this time, electrons from the n-type diffusion layer in the region A pass through a tunnel oxide film and are injected in the floating gate.

On the other hand, the electrons are discharged as follows. That is, the control gate in the region B and the n-type diffusion layer in the region A are biased to 0 V and $V_{pp1}$, respectively to discharge the electrons in the floating gate to the substrate.

The OTPROM region is constituted by the high breakdown voltage layer 36 and a thin oxide film 37.

The write operation is performed as follows. That is, the diffusing layer 35 is biased to $v_{pp2}$ (12.5 V), and a polysilicon film doped with a high concentration n-type impurity is biased to 0 V, so as to apply a breakdown voltage to the thin oxide film 37 located therebetween, when the insulation breakdown occurs, the electrode 39 and the diffusing layer 35 are rendered conductive. Cells are isolated from each other by wells. In the LOGIC region, n- and p-type logic transistors are formed in the independent wells, respectively. Each of gate oxide films 38 has a thickness of 150 Å, and a polysilicon film is formed thereon as a gate electrode. In this case, reference numerals 32 and 33 denote an n-type well and a p-type well, respectively.

Figure 6:
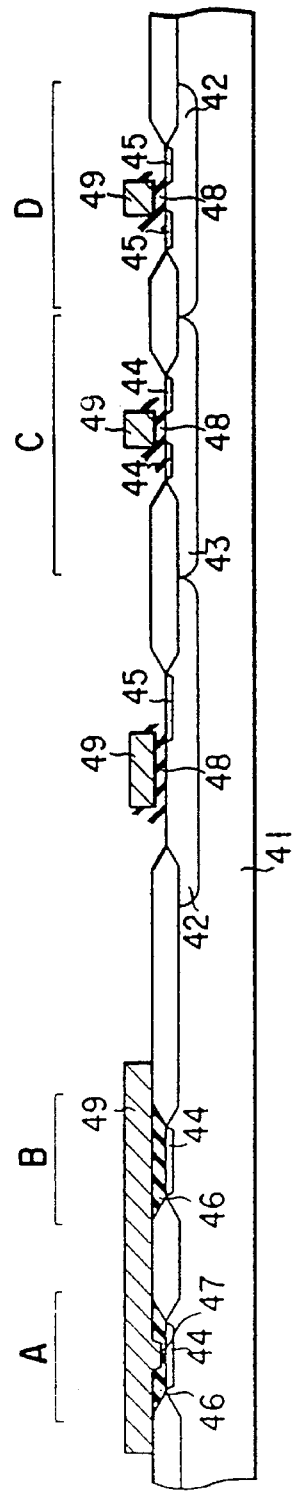
FIG. 6 is a sectional view showing the structure of the third embodiment of the present invention.

The third embodiment shown in FIG. 6. As a basic different point between the second and third embodiments, the thicknesses of some films used in the device of the third embodiment are different from those of the second embodiment. In the EEPROM region of the third embodiment, the thickness of an oxide film in a region B is changed from 150 Å to 400 Å. A region A of the EEPROM region is the same as that of the second embodiment. In this manner, since an increase in thickness of the region B causes a decrease in a capacitive coupling ratio (almost expressed by (capacitance of oxide film in region B)/(capacitance of oxide film in region A), when the value of the ratio is large, so that a write efficiency is improved), the write efficiency depending on the above ratio may be degraded. However, when an increase in thickness of the region B is required to improve the reliability of the EEPROM, and the area of the EEPROM cell can be 2.6 times, the same capacitive coupling ratio as described in the second embodiment can be obtained. At the same time, a highly reliable EEPROM can be obtained.

Although two types of oxide films (90 and 400 Å) are used for an OTPROM in the second embodiment, one flat oxide film having a thickness of 150 Å is used for an OTPROM in the third embodiment as shown in FIG. 6. The same LOGIC region as that of the second embodiment is used in the third embodiment.

As described above, in the third embodiment, when three types of oxide films which have thicknesses of 90, 150, and 400 Å, respectively, are formed through a semiconductor substrate and a first polysilicon film, these films can be freely arranged. This is an advantage, because this embodiment can flexibly cope with a case wherein the thicknesses of these films are decreased in the future. A double power supply scheme using $V_{CC}=5$ V and $V_{pp}=12.5$ V (OTPROM writer system) or a single power supply scheme using only $V_{CC}=5$ V may be used as the power supply of the LSI of the third embodiment when the former is used, the LSI is pin-compatible with an EEPROM. In this case, the voltage of 12.5 V is used for only the OTPROM region, a voltage $V_{PP1}$ used in the EEPROM region is obtained by internally boosting the voltage of $V_{CC}=5$ V, and the voltage $V_{CC}$ is used for a logic transistor.

The latter is applied if the breakdown of the OTPROM can be performed by a voltage obtained by internally boosting the voltage of $V_{CC}=5$ V.

In FIG. 6, reference numeral 41 denotes a p-type semiconductor substrate; 42, an n-type well; 43, a p-type well; 44, an n-type diffusion layer; 45, a p-type diffusion layer; 46, a high breakdown voltage gate oxide film; 47, a very thin gate oxide film; 48, a gate oxide film; and 49, a first polysilicon film.

Figure 7A:
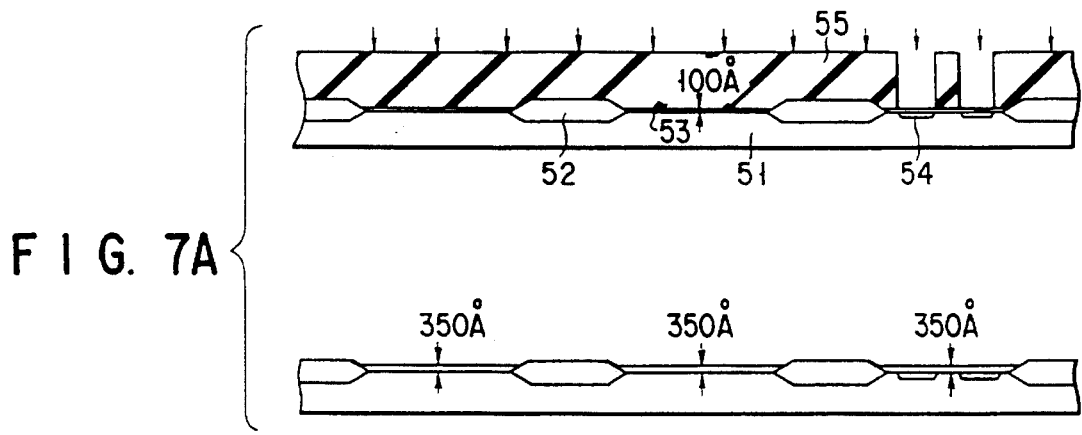
FIGS. 7A to 7C are sectional views showing the steps in manufacturing a memory device for realizing the fourth embodiment of the present invention.
Figure 7B:
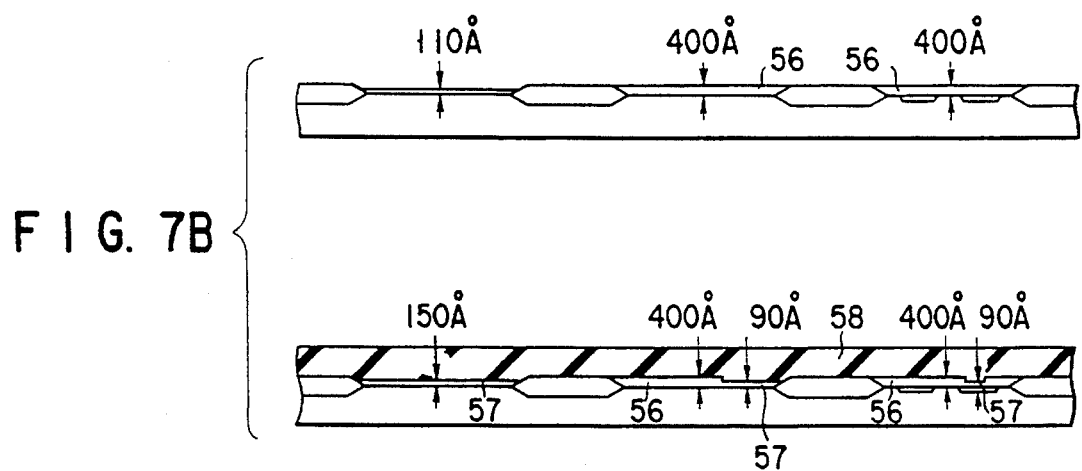
Figure 7C:
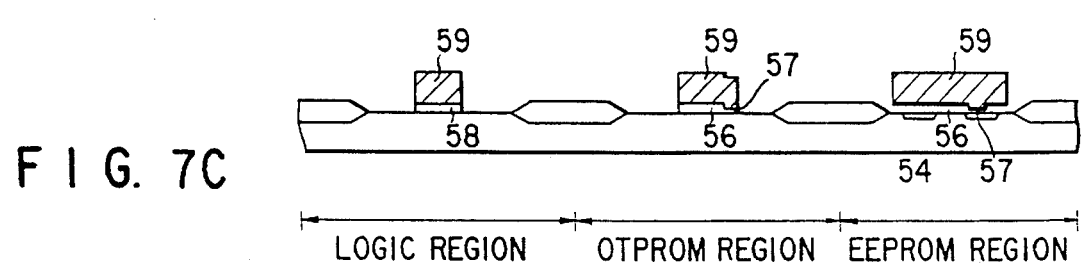

The steps in manufacturing a memory device for realizing the above structure are shown in FIGS. 7A to 7C as the fourth embodiment of the present invention.

Field oxide films 52 are formed by normal isolation to isolate the surface region of a semiconductor substrate 51 into EEPROM, OTPROM, and LOGIC regions, and oxide films 53 each having a thickness of about 100 Å are grown by thermal oxidation in these regions, respectively. Thereafter, a resist 55 is coated on the entire surface of the resultant structure. Furthermore, a region prospectively serving as an EEPROM n-type impurity region 54 is etched by normal photoetching. Ion implantation is performed through the oxide film 53 to form the EEPROM n-type impurity region 54. Subsequently, the resultant structure is annealed at 950° C. in a nitrogen atmosphere (FIG. 7A).

The 100- Å oxide films 53 are removed with an ammonium fluoride solution, and oxide films each having a thickness of about 350 Å are grown by thermal oxidation. The 350- Å oxide film stacked in the LOGIC region is removed by normal photoetching with an ammonium fluoride solution. Subsequently, an oxide film having a thickness of 110 Å is formed in the LOGIC region. At this time, each region where the 350- Å oxide film is left from the beginning becomes a high breakdown voltage gate oxide film 56 having a thickness of 400 Å (FIG. 7B).

Very thin regions 57 in the EEPROM and OTPROM regions are removed with an ammonium fluoride solution by photoetching, and oxide films each having a thickness of 90 Å are formed in the EEPROM and OTPROM regions, respectively. In this manner, when the oxidation is performed three times, three types of films which have thicknesses of 400, 150, and 90 Å, respectively, the high breakdown voltage gate oxide films 56, a logic gate oxide film 58, and the very thin regions or oxide films 57 can be stacked and formed. Subsequently, a first polysilicon film 59 is deposited on the entire surface of the resultant structure, and the polysilicon film 59 is patterned (FIG. 7C).

N- and p-type diffusion layers corresponding to the source and drain of the transistor are formed by a high-concentration ion implantation (not shown). Subsequently, the fourth embodiment is realized by the normal steps in manufacturing a CMOS.

Although the embodiments of the present invention have been described above, the present invention is not limited to the embodiments. For example, although the process for integrally arranging the single-poly cell and the logic transistor has been described in each of the embodiments, any structure which has films having a plurality of thicknesses and arranged below a first polysilicon layer may be used in the present invention. In addition, although oxide films are formed using thermal oxidation in the embodiments, these films may be formed using chemical vapor-phase growth.

As described above in detail, according to the present invention, a non-volatile memory and a 5 V system logic circuit can be properly matched with each other on a single chip, and the number of photoetching steps can be decreased from five to three. In addition, the present invention can improve flexibility for scaling in the future.

According to the above improved process, since the first oxide film in the high breakdown voltage region is used as a dummy oxide film, the first oxide film and the dummy oxide film in the logic region can be simultaneously removed by performing photoetching once. In this manner, according to the present invention, the number of steps can be decreased, the process can be simplified, and the process having a low cost can be proposed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor nonvolatile memory device, comprising the steps of:

performing dement isolation to isolate an element active region from a field region;

performing photoetching of a part of said element active region;

selectively implanting ions;

forming a first insulating film;

etching a part of said first insulating film using photoetching;

forming a second insulating film;

etching parts of said first and second insulating films using photoetching;

forming a third insulating film; and depositing a first polysilicon layer, wherein id first insulating film is a high breakdown voltage insulating film, said second insulating film is a gate insulating film, and said third insulating film is a tunnel insulating film.

2. A method of manufacturing a semiconductor device, comprising the steps of:

forming a first insulating film having a first film thickness on a semiconductor substrate;

masking a first portion of a surface region of said first insulating film with a first photoresist using photoetching;

implanting impurity ions in the semiconductor substrate through a first exposed part of said first insulating film;

removing said first photoresist;

masking a second portion of the surface region of said first insulating film with a second photoresist using photoetching;

removing a second exposed part of said first insulating film;

removing said second photoresist; and forming a second insulating film having a second film thickness, wherein said first insulating film is a high breakdown voltage insulating film and said second insulating film is a gate insulating film.

3. A method of manufacturing a semiconductor device, comprising the steps of:

forming a first insulating film having a first film thickness on a semiconductor substrate;

masking a part of a surface region of said first insulating film with a first photoresist using photoetching;

removing an exposed part of said first insulating film;

removing said first photoresist;

forming a second insulating m having a second film thickness;

masking a part of a surface region of said second insulating film with a second photoresist using photoetching;

removing an exposed part of said second insulating film;

removing said second photoresist; and forming a third insulating film having a third film thickness, wherein said first insulating film is a high breakdown voltage insulating film, said second insulating film is a gate insulating film, and said third insulating film is a tunnel insulating, film.

4. A method according to claim 2, further comprising the steps of:

masking a part of a surface region of said second oxide film with a third photoresist using photoetching;

removing an exposed part of said second oxide film removing said third photoresist; and forming a third insulating film having a third film thickness.

5. A method according to claim 1, further comprising the steps of:

diffusing an impurity in said first polysilicon layer;

masking a part of a surface region of said first polysilicon layer with a second photoresist using photoetching;

removing an exposed part of said first polysilicon layer; and removing said second photoresist.

6. A method according to claim 2, further comprising the steps of;

forming a first polysilicon layer;

diffusing an impurity in said first polysilicon layer;

masking a part of a surface region of said first polysilicon layer with a third photoresist using photoetching;

removing an exposed part of said first polysilicon layer; and removing said third photoresist.

7. A method according to claim 3, further comprising the steps of:

forming a first polysilicon layer;

diffusing an impurity in said first polysilicon layer;

masking a part of a surface region of said first polysilicon layer with a third photoresist using photoetching;

removing an exposed part of said first polysilicon layer; and removing said third photoresist.

8. A method according to claim 4, further comprising the steps of:

forming a first polysilicon layer;

diffusing an impurity in said first polysilicon layer;

masking a part of a surface region of said first polysilicon layer with a fourth photoresist using photoetching;

removing an exposed part of said first polysilicon layer; and removing said fourth photoresist.

9. A method of manufacturing a semiconductor nonvolatile memory device, comprising the steps of:

performing element isolation to isolate a first region on a semiconductor substrate from a second region on said semiconductor substrate;

forming a first insulating film on said first and second regions;

removing said first insulating film from said second region using photoetching;

selectively implanting ions in said second region;

forming a second insulating film on said second region of said semiconductor substrate;

etching a part of said first insulating film using photoetching to form a third insulating film; and depositing a first polysilicon film on said first, second, and third insulating films.

10. A method according to claim 9, further comprising the steps of:

diffusing an impurity in said first polysilicon film;

masking a part of a surface region of said first polysilicon film with a first photoresist using photoetching;

removing an exposed part of said first polysilicon film; and removing said first photoresist.

* * * * *